(12) United States Patent
Kim et al.

(10) Patent No.: US 7,773,440 B2
(45) Date of Patent: Aug. 10, 2010

(54) ZQ CALIBRATION CONTROLLER AND METHOD FOR ZQ CALIBRATION

(75) Inventors: Ki-Ho Kim, Kyoungki-Do (KR); Kee-Teok Park, Kyoungki-Do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 270 days.

(21) Appl. No.: 11/967,699

(22) Filed: Dec. 31, 2007

(65) Prior Publication Data
US 2008/0219068 A1    Sep. 11, 2008

(30) Foreign Application Priority Data
Mar. 8, 2007    (KR) ............... 10-2007-0022789

(51) Int. Cl.
*G11C 7/00*    (2006.01)
(52) U.S. Cl. .................... 365/201; 326/30; 341/120
(58) Field of Classification Search .............. 365/201; 326/30; 341/120
See application file for complete search history.

(56) References Cited

U.S. PATENT DOCUMENTS

| 4,817,013 | A  | * | 3/1989  | Corenman et al. ........... 702/30 |
| 7,126,510 | B2 | * | 10/2006 | Alon et al. .................. 341/120 |
| 7,227,376 | B2 | * | 6/2007  | Ahmad et al. ................. 326/30 |
| 7,369,455 | B2 | * | 5/2008  | Nam ...................... 365/230.08 |

FOREIGN PATENT DOCUMENTS

| JP | 2006-203405    | 8/2006 |
| KR | 1020070044790  | 4/2007 |

OTHER PUBLICATIONS

Foreign Notice of Allowance, Application No. 10-2007-0022789, issued on Sep. 25, 2008.

* cited by examiner

*Primary Examiner*—Son T Dinh
*Assistant Examiner*—Nam Nguyen
(74) *Attorney, Agent, or Firm*—IP & T Law Firm PLC (57) ABSTRACT

A ZQ calibration circuit performs a ZQ calibration additionally in an initial operation of a semiconductor memory device. The ZQ calibration controller of the ZQ calibration circuit includes a first signal generator, a second signal generator, and a control unit. The first signal generator generates a pre-calibration signal during an initialization of the semiconductor memory device. The second signal generator generates ZQ calibration signals in response to a ZQ calibration command. The control unit outputs signals to control a ZQ calibration in response to the pre-calibration signal and the ZQ calibration signals.

18 Claims, 13 Drawing Sheets

| FUNCTION | CKE | | /CS | /RAS | /CAS | /WE | BA3 ~BA0 | A15 ~A13 | A12 | A10 | A11, A9~A0 |
|---|---|---|---|---|---|---|---|---|---|---|---|
| | Prev' Cycle | Next Cycle | | | | | | | | | |
| ZQ CALIBRATION LONG (ZQCL) | H | H | L | H | H | L | X | X | X | 1 | X |
| ZQ CALIBRATION SHORT (ZQCS) | H | H | L | H | H | L | X | X | X | 0 | X |

FIG. 2B

| Symbol | DDR3 800/1066/1333/1600 | | UNITS |
|---|---|---|---|
| | MIN | MAX | |
| tZQOPER | 256 | NA | tCK |
| tZQINIT | 512 | NA | tCK |
| tZQCS | 64 | NA | tCK |

ZQ CALIBRATION CONTROLLER AND METHOD FOR ZQ CALIBRATION

CROSS-REFERENCE TO RELATED APPLICATIONS

The present invention claims priority to Korean patent application number. 10-2007-0022789, filed on Mar. 8, 2007, which is incorporated by reference in its entirety.

BACKGROUND OF THE INVENTION

The present invention relates to a ZQ calibration circuit in a semiconductor memory device, and more particularly to a ZQ calibration operation controller circuit for such a ZQ calibration circuit.

Generally, semiconductor memory devices that include an integrated circuit, such as a microprocessor, a memory circuit and a gate array circuit, are used in various electrical appliances, e.g., personal computers, server computers and workstations. As the operating speed of the electrical appliances increases, a swing width of signals transmitted between semiconductor memory devices inside the electrical appliances decreases to minimize a delay time taken to transmit the signals. However, as the swing width decreases, signal transmission is affected by external noise to a greater degree and signal reflection in an interface terminal increases due to impedance mismatching.

The impedance mismatch is caused by variation of the manufacturing process, the supply voltage and the operating temperature (PVT). This impedance mismatch makes it hard to transmit data at high speeds. Because a signal outputted from a semiconductor memory device may be distorted by the impedance mismatch, a malfunction such as a set up/hold failure or a misjudgment of a signal level may be caused in a corresponding semiconductor memory device receiving the distorted signal.

A semiconductor memory device may include an input circuit for receiving external signals through an input pad and an output circuit for outputting internal signals through an output pad. Particularly, a semiconductor memory device operating at a high speed may include an impedance matching circuit for matching interface impedance with another semiconductor memory device near the pads in order to prevent the above malfunctions.

Generally, in a semiconductor memory device transmitting a signal, source termination is performed by an output circuit. In a semiconductor memory device receiving a signal, parallel termination may be performed by a termination circuit connected in parallel to an input circuit.

The ZQ calibration is a process for generating pull-up and pull-down calibration codes that change as PVT conditions change. Resistance values of input and output circuits are calibrated by using the pull-up and pull-down calibration codes. The ZQ calibration is performed in a ZQ calibration circuit described below.

Figure 1:
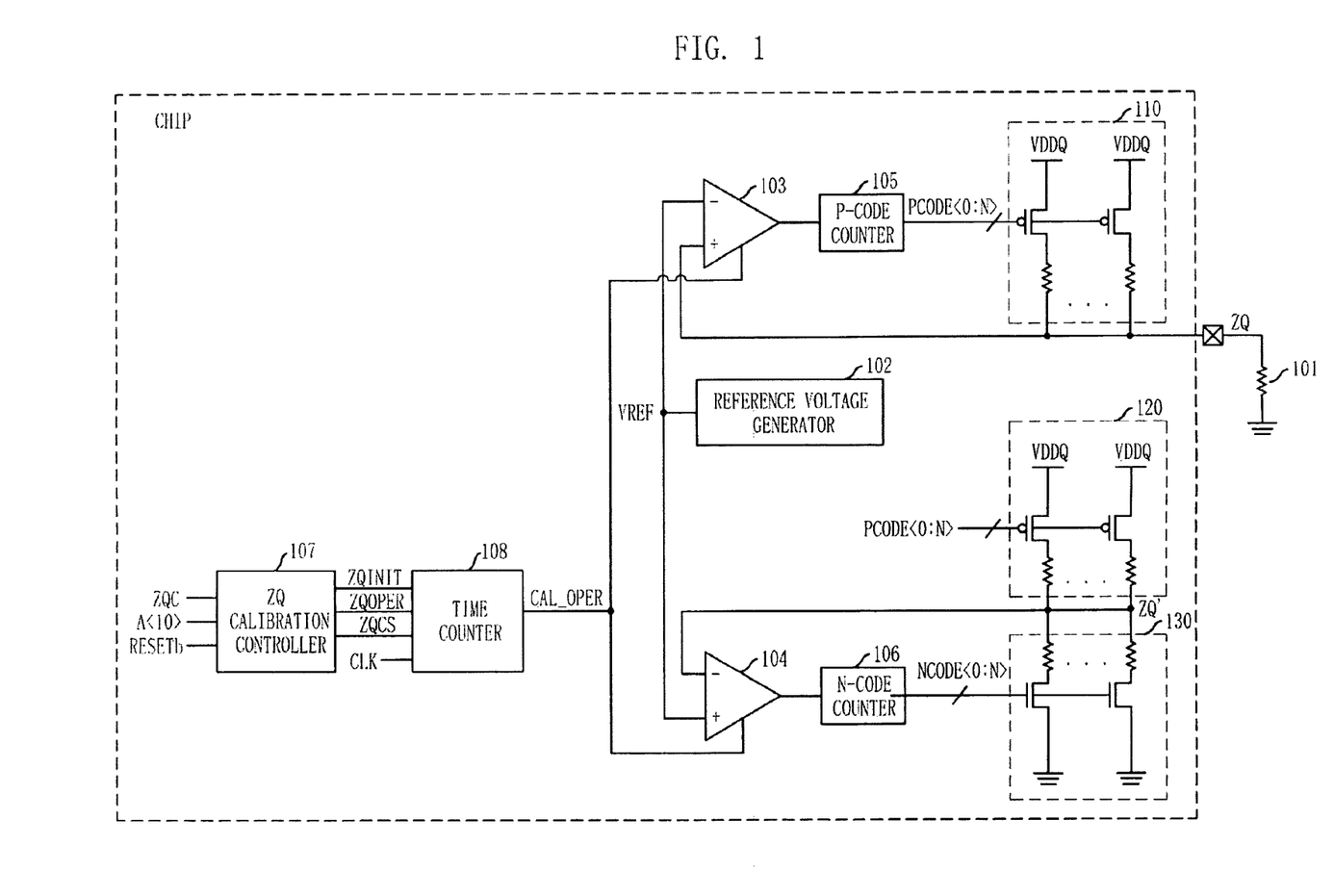
FIG. 1 is a block diagram of a conventional ZQ calibration circuit.

FIG. 1 is a block diagram of a conventional ZQ calibration circuit. The ZQ calibration circuit includes a first pull-up resistance unit 110, a second pull-up resistance unit 120, a pull-down resistance unit 130, a reference voltage generator 102, comparators 103 and 104, and p-code and n-code counters 105 and 106.

A supply voltage VDDQ is divided by the first pull-up resistance unit 110 and a reference resistor 101, thereby providing a voltage to a node ZQ. The reference resistor 101, which is connected to a pin coupled to the node ZQ, generally has a resistance of 240Ω. The comparator 103 compares the voltage at the node ZQ with a reference voltage VREF outputted from the reference voltage generator 102, thereby generating an up/down signal UP/DN. The reference voltage VREF is generally set to half of the supply voltage, i.e. VDDQ/2.

The p-code counter 105 receives the up/down signal UP/DN, thereby generating a binary code PCODE<0:N>. The binary code PCODE<0:N> turns on/off MOS transistors coupled in parallel in the first pull-up resistance unit 110, thereby calibrating resistance of the first pull-up resistance unit 110. The calibrated resistance of the first pull-up resistance unit 110 has an effect on the voltage at the node ZQ. The above operations are repeated. That is, the pull-up calibration is performed in the first pull-up resistance unit 110 so that the resistance of the first pull-up resistance unit 110 becomes identical to that of the reference resistor 101.

The binary code PCODE<0:N> generated during the pull-up calibration is also inputted to the second pull-up resistance unit 120 and determines its resistance. Similarly to the pull-up calibration, a pull-down calibration is performed. A voltage at a node ZQ' becomes identical to the reference voltage VREF by applying a binary code NCODE<0:N> generated by the comparator 104 and the n-code counter 106. The pull-down calibration is performed so that the resistance of the pull-down resistance unit 130 becomes identical to that of the second pull-up resistance unit 120.

The ZQ calibration includes the pull-up calibration and the pull-down calibration. The binary codes PCODE<0:N> and NCODE<0:N> resulting from the ZQ calibration are inputted to an input or output circuit so as to calibrate the respective resistors of the resistance units. In the case of the semiconductor memory device, the binary codes PCODE<0:N> and NCODE<0:N> determine the resistance of pull-up and pull-down resistors connected to DQ pads. The pull-up and pull-down resistors have a similar layout to the above pull-up and pull-down resistance units.

While an output driver of the semiconductor memory device uses both pull-up and pull-down resistors, an input buffer of the semiconductor memory device uses only a pull-up resistor. In that case, the ZQ calibration circuit includes the pull-up resistance unit 110, the p-code counter 105 and comparator 103. Only the pull-up calibration is then performed.

The ZQ calibration further employs a ZQ calibration controller 107 and a time counter 108 for controlling the ZQ calibration. The ZQ calibration controller 107 generates ZQ calibration signals ZQINIT, ZQOPER and ZQCS according to the type of ZQ calibration. The CAL_OPER signal from the time counter 108 activates the comparators 103 and 104 for a predetermined time according to the ZQ calibration signals ZQINIT, ZQOPER and ZQCS and a clock signal CLK, thereby performing the ZQ calibration.

Figure 2A:
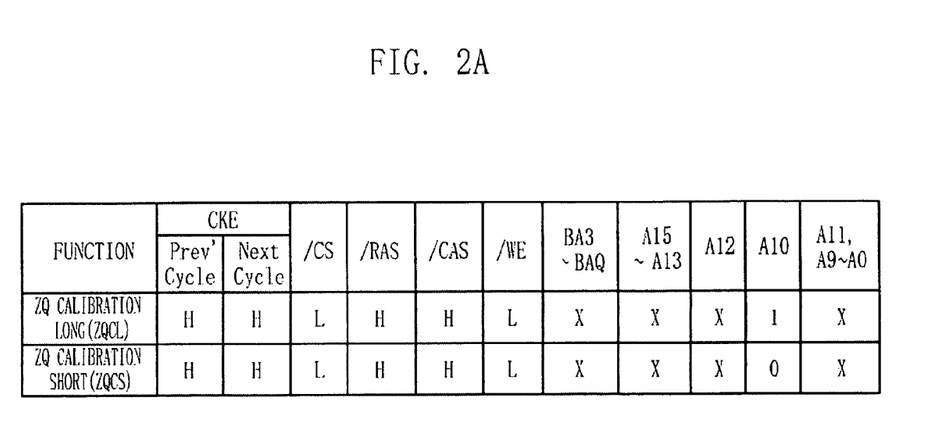
FIG. 2A is a table of the logic levels of corresponding signals according to types of ZQ calibration.

FIG. 2A is a table showing the logic levels of corresponding signals CKE, /CS, /RAS, /CAS, /WE and A10 according to the types of ZQ calibration. The other signals referred to in the table indicate bank addresses BA3~BA0 or cell addresses A15~13, A12, A11 and A9~0, which have no relation to ZQ calibration in accordance with the present invention. A detailed description of the latter will therefore be omitted. The ZQ calibration is classified into long type ZQ calibration (ZQCL) and short type ZQ calibration (ZQCS). Referring to FIG. 2A, the long and the short type ZQ calibration is determined according to a logic level of a signal A10.

Figure 2B:
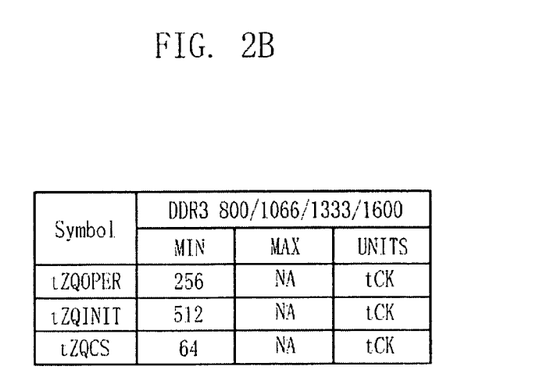
FIG. 2B is a table of timing parameters according to the types of ZQ calibration.

FIG. 2B is a table of timing parameters according to the types of ZQ calibration. According to the circumstances, the ZQ calibration is performed for a relatively long time or for a relatively short time. The former is the long type ZQ calibration and the latter is the short type ZQ calibration. Initial ZQ calibration after a power-up and ZQ calibration performed by a controller during an operation are classified as the long type calibration. Operation cycles tZQINIT and tZQOPER of the initial and operating ZQ calibrations are at least 512 and 256 cycles, respectively. Referring to FIG. 2B, an operation cycle tZQCS of the short type ZQ calibration is at least 64 cycles.

Figure 3:
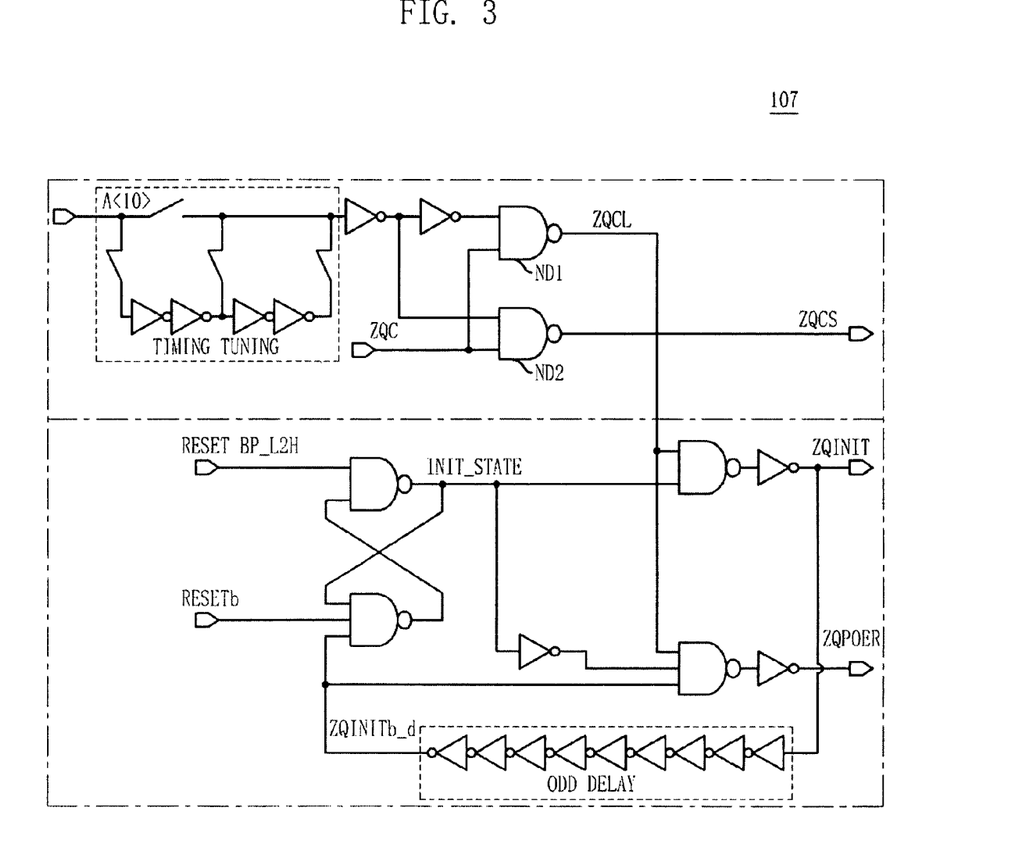
FIG. 3 is a schematic circuit diagram of a ZQ calibration controller described in FIG. 1.

FIG. 3 is a schematic circuit diagram of the ZQ calibration controller 107 described in FIG. 1, and includes logic gates ND1-ND6, delay units 301 and 302, and inverters 303-307.

A ZQ calibration command ZQC is enabled by combining a chip select signal /CS, a row address strobe signal /RAS, a column address strobe signal /CAS and a write enable signal /WE (see FIG. 2A). When the ZQ calibration command ZQC is enabled and signal A10 is disabled (at a logic low level), a logic gate ND1 outputs a signal ZQCL at a logic low level and a logic gate ND2 outputs the ZQ calibration signal ZQCS at a logic high level. Accordingly, the short type ZQ calibration is performed in response to the ZQ calibration signal ZQCS.

When the ZQ calibration command ZQC is enabled and the signal A10 is enabled (at a logic high level), the logic gate ND1 outputs the signal ZQCL at a logic high level and the logic gate ND2 outputs the ZQ calibration signal ZQCS at a logic low level. Accordingly, the long type ZQ calibration is performed in response to the signal ZQCL.

When the signal ZQCL is enabled (at a logic high level), the ZQ calibration signal ZQINIT or ZQPOER is enabled. After a semiconductor memory device is powered-up, a signal INIT_STATE is initially at a logic high level. Reset signal RESETb is for resetting the semiconductor memory device, and signal RESET BP_L2H is a delayed reset signal for a predetermined time.

Accordingly, the ZQ calibration signal ZQINIT is enabled (at a high logic level) and the initial ZQ calibration is performed. After a predetermined time, the signal INIT_STATE goes to a logic low level in response to a feedback signal ZQINITb_d. The ZQ calibration signal ZQOPER is enabled. The ZQ calibration is performed in response to the ZQ calibration signal ZQOPER.

Figure 4:
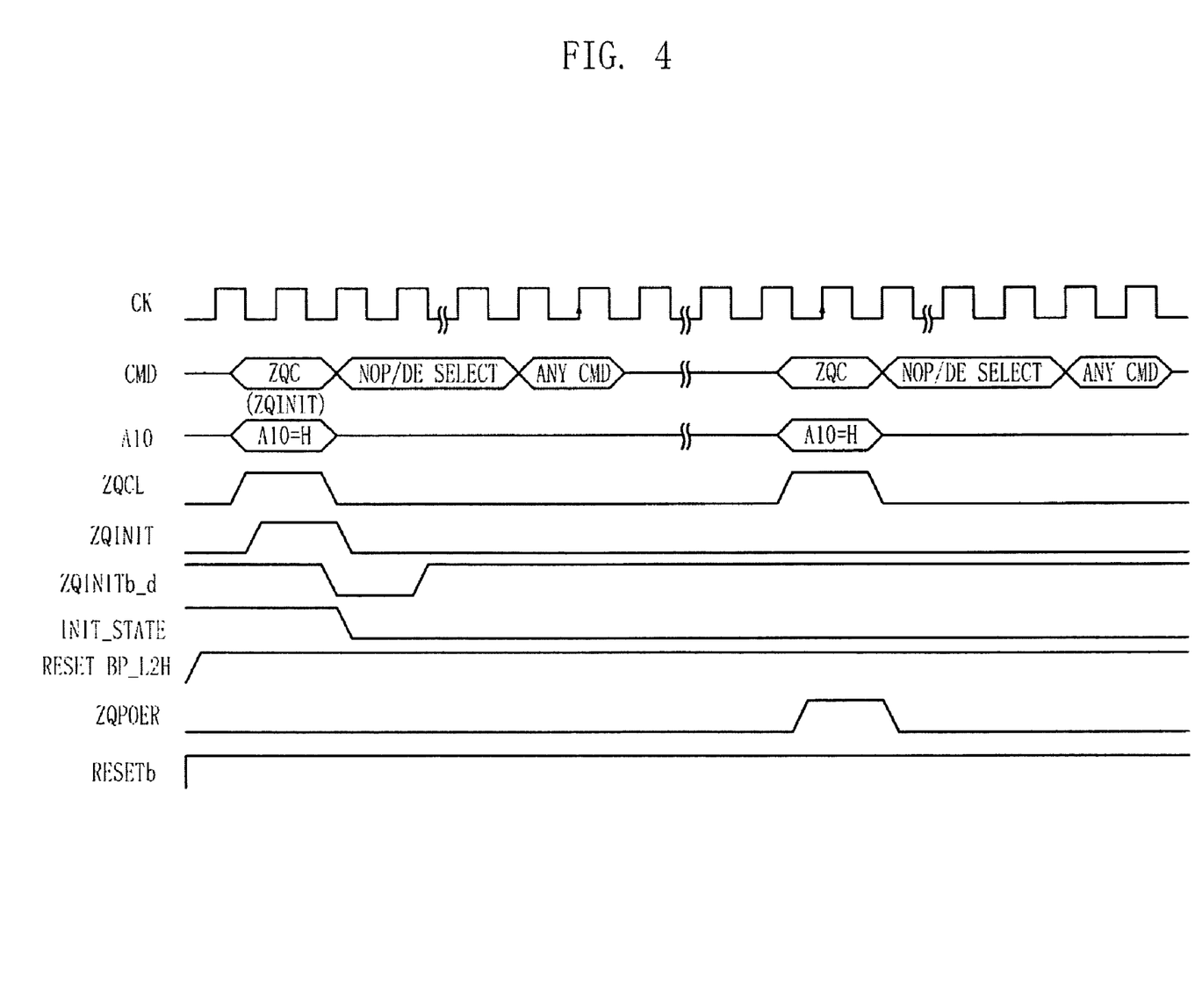
FIG. 4 is a signal timing diagram for the operation of the ZQ calibration controller described in FIG. 3.

FIG. 4 illustrates a signal timing diagram for the operation of the ZQ calibration controller described in FIG. 3. That is, looking at the command (CMD) trace, when the ZQ calibration command ZQC is enabled, the short type ZQ calibration is performed in response to the logic low level of signal A10 and the long type ZQ calibration is performed in response to the logic high level of signal A10. In case of the long type ZQ calibration, the initial ZQ calibration is performed in response to the ZQ calibration signal ZQINIT initially. And then, the ZQ calibration is performed in response to the ZQ calibration signal ZQOPER. The clock waveform is shown at CLK.

Figure 5:
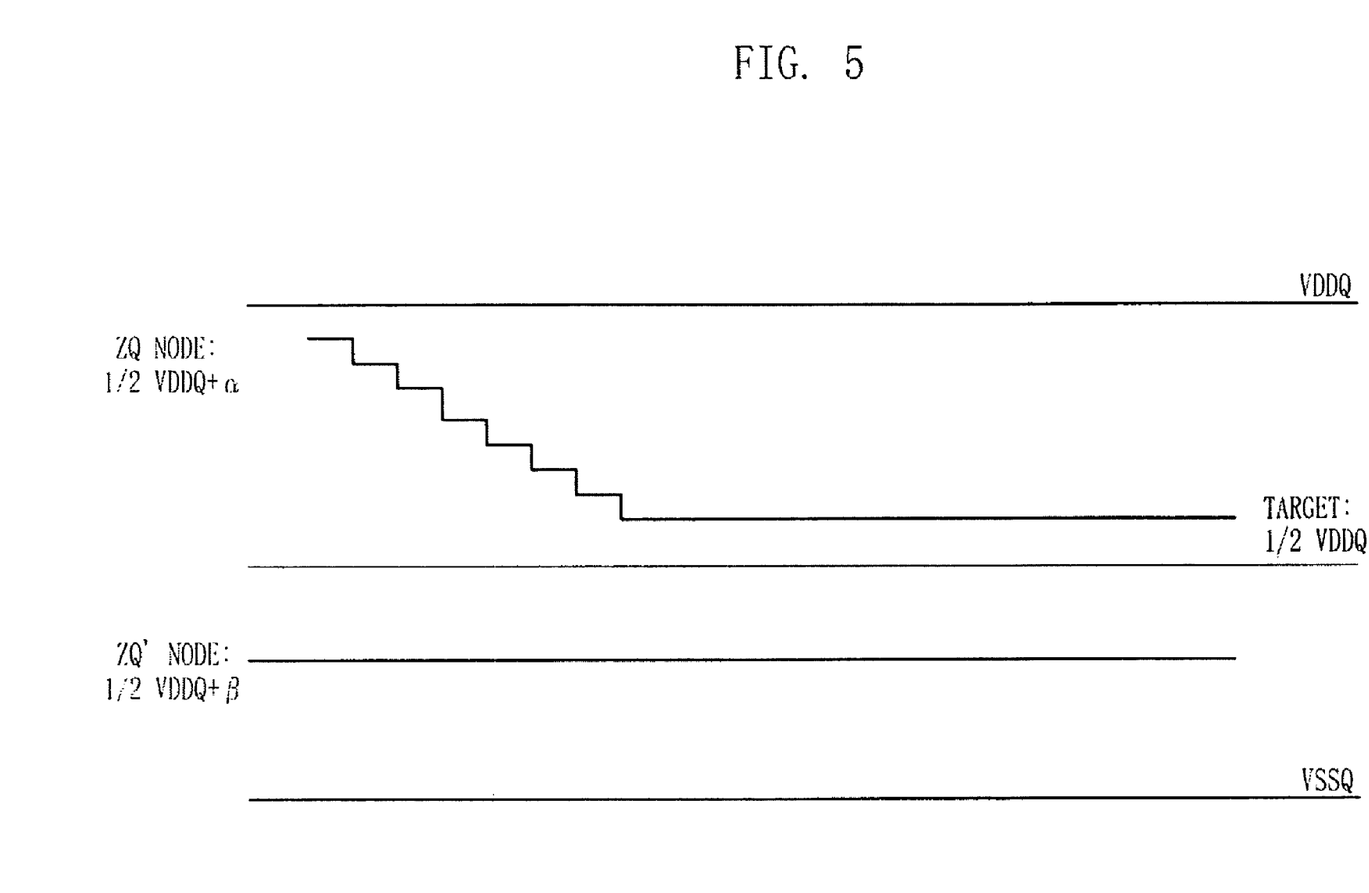
FIG. 5 is a signal timing diagram of voltage levels on the ZQ and ZQ' nodes of the ZQ calibration circuit for an initial ZQ calibration.

FIG. 5 illustrates a signal timing diagram for the voltage levels on the ZQ and ZQ' nodes of the ZQ calibration circuit shown in FIG. 1, according to the initial ZQ calibration.

The voltage levels converge at half of the supply voltage (VDDQ/2) for the initial ZQ calibration, which is performed in at least 512 cycles. However, in the case of a large variation of PVT, the voltage levels cannot reach the target level during the initial ZQ calibration. Generating the pull-up and the pull-down codes PCODE<0:N> and NCODE<0N:> is therefore not completed, and the input buffer and output driver fail to have a target resistance. In this case, malfunctions are caused by the impedance mismatch. VSSQ is the reference voltage that VDDQ is determined relative to, i.e. the source voltage in the case where VDDQ is the drain voltage.

SUMMARY OF THE INVENTION

Preferred embodiments of the present invention are directed to providing a ZQ calibration circuit for performing a ZQ calibration additionally in an initial operation of a semiconductor memory device.

In one preferred embodiment, a ZQ calibration controller of a semiconductor memory device includes a first signal generator for generating a pre-calibration signal during an initialization of the semiconductor memory device, a second signal generator for generating ZQ calibration signals in response to a ZQ calibration command, and a control unit for outputting signals to control a ZQ calibration in response to the pre-calibration signal and the ZQ calibration signals.

In another preferred embodiment, a ZQ calibration circuit of a semiconductor memory device includes a ZQ calibration unit for performing ZQ calibration, a ZQ calibration controller for activating the ZQ calibration unit in response to a ZQ calibration command, and a pre-calibration controller for activating the ZQ calibration unit in response to an initializing signal of the semiconductor memory device.

In a further preferred embodiment, a method for performing a ZQ calibration of a semiconductor memory device includes performing a pre-calibration in response to an initializing signal of the semiconductor memory device, and performing a ZQ calibration in response to a ZQ calibration command.

DESCRIPTION OF SPECIFIC EMBODIMENTS

A semiconductor memory device in accordance with the present invention also performs a ZQ calibration at initial operation in addition to a ZQ calibration in response to a ZQ calibration command. Accordingly the semiconductor memory device is provided with enough time for ZQ calibration at initial operation, and completes the ZQ calibration stably even if the variation of PVT is large.

Hereinafter, a ZQ calibration circuit in accordance with the present invention will be described in detail referring to the accompanying drawings.

Figure 6:
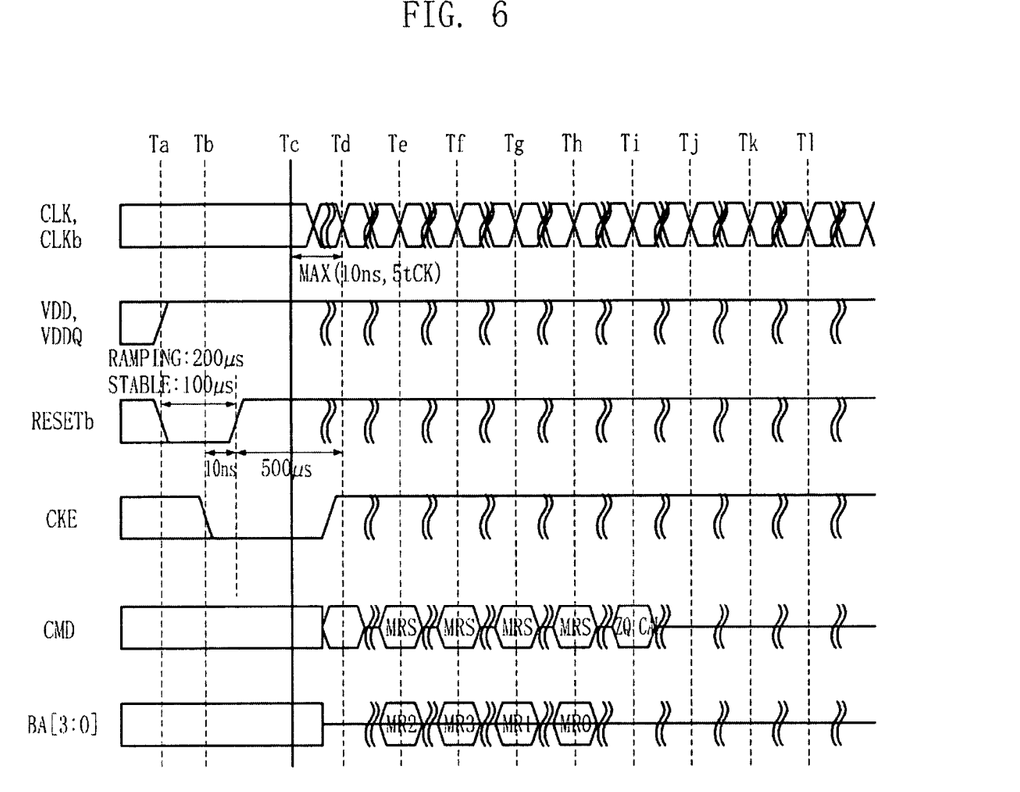
FIG. 6 is a signal timing diagram of an initial operation of a double data rate 3 (DDR3) semiconductor memory device.

FIG. 6 illustrates a signal timing diagram for initial operation of a double data rate 3 (DDR3) semiconductor memory device, showing clock signal CLK, clock bar signal CLKb, supply voltage VDDQ, reset signal RESETb, clock enable signal CKE, command CMD and bank address BA at time intervals Ta-Tl inclusive.

After the semiconductor memory device is powered-up, a reset signal RESETb is disabled at a logic high level. Preferably, 500 µs of time is provided for initialization of the semiconductor memory device. That is, the time from disablement of the reset signal RESETb to enablement of a clock enable signal CKE is preferably 500 µs. In a conventional ZQ calibration circuit, where there is a large variation of PVT, pull-up and pull-down resistance units fail to have identical resistances to an external resistance during the initial ZQ calibration, and an impedance mismatch is caused. Accordingly, in accordance with the present invention, the ZQ calibration is automatically performed for longer than the conventional ZQ calibration during the 500 µs of initializing time. By employing ZQ calibration in accordance with the present invention, an impedance mismatch can be prevented even where there is a large variation of PVT. The ZQ calibration is defined to include a pre-calibration in the present invention.

Figure 7:
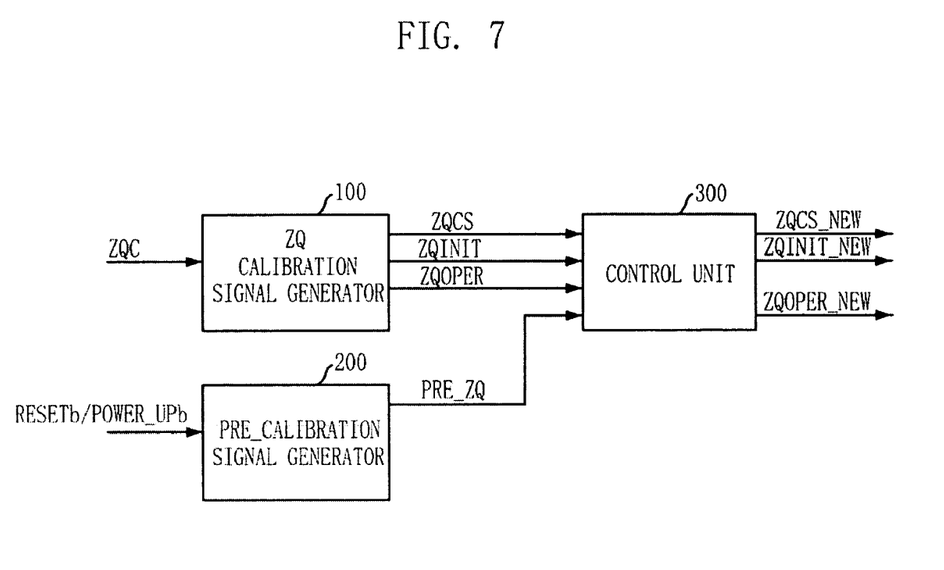
FIG. 7 is a block diagram of a ZQ calibration controller of a semiconductor memory device in accordance with the present invention.

FIG. 7 illustrates a block diagram of a ZQ calibration controller of a semiconductor memory device in accordance with the present invention. The ZQ calibration controller includes a ZQ calibration signal generator 100, a pre-calibration signal generator 200 and a control unit 300.

The ZQ calibration signal generator 100 generates the ZQ calibration signals ZQINIT, ZQOPER and ZQCS in response to the ZQ calibration command ZQC. The ZQ calibration signal generator 100 operates similarly to a conventional ZQ calibration controller. The ZQ calibration signal generator may have the same structure as described in FIG. 3, for example. As described above, the ZQ calibration signals ZQINIT, ZQOPER and ZQCS are for ZQ calibration with different of operating times.

The pre-calibration signal generator 200 generates a pre-calibration signal PRE_ZQ at initialization of a semiconductor memory device. That is, the pre-calibration signal PRE_ZQ is enabled at the initialization of the semiconductor memory device using initializing signals. The initializing signals for which the logic level changes at the initialization of the semiconductor memory device include the reset signal RESETb and a power up signal POWER_UPb.

The control unit 300 controls the ZQ calibration in response to the pre-calibration signal PRE_ZQ and the ZQ calibration signals ZQCS, ZQINIT and ZQOPER. The ZQ calibration is controlled to be performed when at least one of the pre-calibration signal PRE_ZQ and the ZQ calibration signals ZQCS, ZQINIT and ZQOPER is enabled.

For example, the control unit 300 generates the ZQ calibration signals ZQCS_NEW, ZQINIT_NEW and ZQOPER_NEW corresponding to the ZQ calibration signals ZQCS, ZQINIT and ZQOPER, respectively. The semiconductor memory device performs a corresponding type of ZQ calibration according to the ZQ calibration signals ZQCS_NEW, ZQINIT_NEW and ZQOPER_NEW. In addition, the control unit 300 generates one of the ZQ calibration signal ZQCS_NEW, ZQINIT_NEW and ZQOPER_NEW in response to the pre-calibration signal PRE_ZQ. Which of the calibration signals ZQCS, ZQINIT and ZQOPER are to be generated can be controlled. This will be described later in reference to FIG. 11.

Figure 8A:
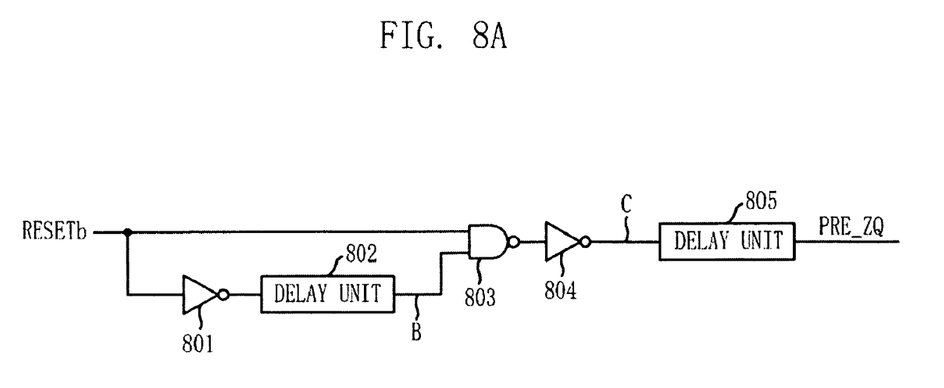
FIG. 8A is a block diagram of a pre-calibration signal generator as described in FIG. 7 in accordance with a first preferred embodiment of the present invention.
Figure 9A:
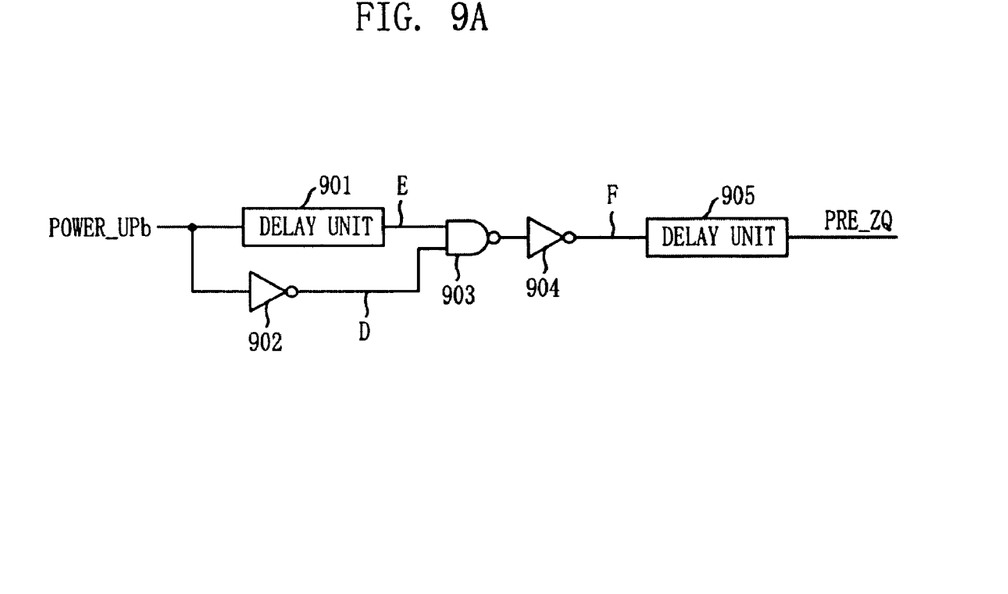
FIG. 9A is a block diagram of the pre-calibration signal generator as described in FIG. 7 in accordance with a second preferred embodiment of the present invention.
Figure 10A:
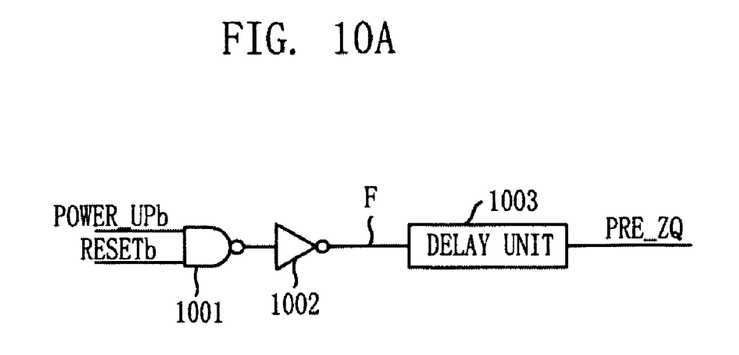
FIG. 10A is a block diagram of the pre-calibration signal generator as described in FIG. 7 in accordance with a third preferred embodiment of the present invention.

FIGS. 8A, 9A and 10A illustrate a block diagram of the pre-calibration signal generator 200 in accordance with a preferred embodiment of the present invention.

The pre-calibration signal generator generates a pre-calibration signal PRE_ZQ of pulse type at initialization of the semiconductor memory device. Because the conventional ZQ calibration signals ZQCS, ZQINIT and ZQOPER are of pulse type, the pre-calibration signal PRE_ZQ is also generated as a pulse type signal.

As described above, the pre-calibration signal generator enables the pre-calibration signal PRE_ZQ using the initializing signal of the semiconductor memory device. A preferred embodiment using the reset signal RESETb is described in FIGS. 8A and 8B. The pre-calibration signal generator using the reset signal RESETb includes a logic gate, inverters and delay units.

A first inverter 801 inverts the reset signal RESETb. A first delay unit 802 delays an output of the first inverter 801. The logic gate 803 performs a NAND operation on the reset signal RESETb and an output of the first delay unit 802. A second inverter 804 inverts an output of the logic gate 803. A second delay unit 805 delays an output of the second inverter 804, thereby generating the pre-calibration signal PRE_ZQ.

Figure 8B:
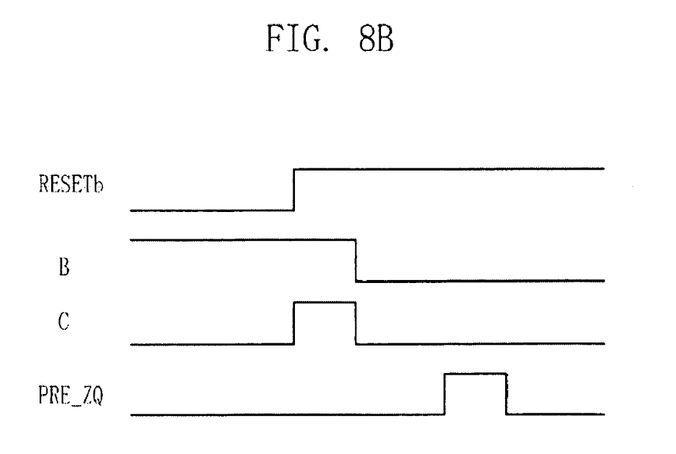
FIG. 8B is a signal timing diagram for operation of the pre-calibration signal generator described in FIG. 8A.

FIG. 8B illustrates a signal timing diagram of an operation of the pre-calibration signal generator described in FIG. 8A. The reset signal RESETb enabled in a logic low level at initialization of the semiconductor memory device becomes a logic high level after a predetermined time. The pre-calibration signal PRE_ZQ is enabled in response to the reset signal RESETb. Waveforms B and C in FIG. 8B correspond to the waveforms at points B and C in FIG. 8A respectively.

A pulse width of the pre-calibration signal PRE_ZQ is determined according to a time delay amount of the first delay unit 802. The pulse width is set to 0.5~1tCK (1 tCK=1 clock period), which is approximately the same as that of the conventional ZQ calibration signal ZQINIT. The second delay line 805 determines an enablement time of the pre-calibration signal PRE_ZQ. The enablement time is set to 10 ns from a power up of the semiconductor memory device, in order for the semiconductor memory device to operate stably. Because the time delays of the first and the second delay unit 802 and 805 are just for determining the timing of the signals, they may be controlled to be different according to an operation speed and a manufacturing condition of the semiconductor memory device.

Figure 9B:
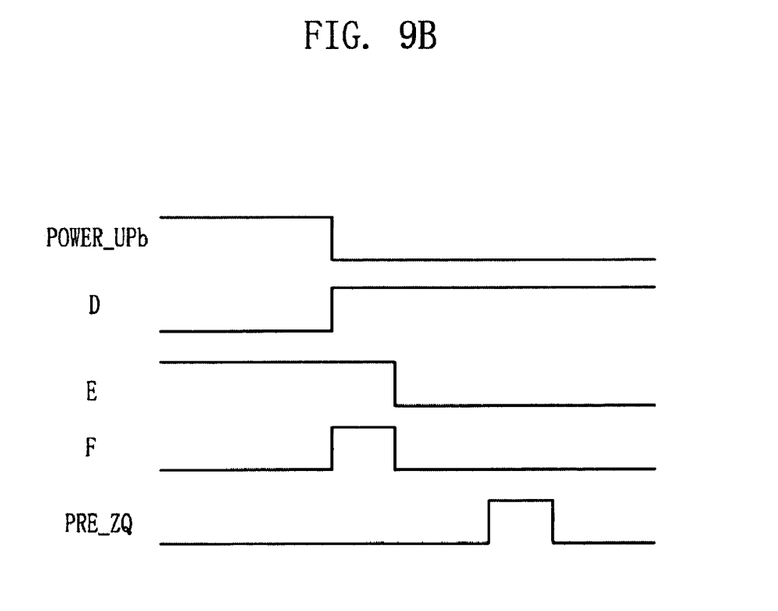
FIG. 9B is a signal timing diagram for the operation of the pre-calibration signal generator described in FIG. 9A.

FIGS. 9A and 9B illustrate a preferred embodiment for generating a pre-calibration signal PRE_ZQ with the power up signal POWER_UPb. The pre-calibration signal generator using the power up signal POWER_UPb includes a logic gate, inverters and delay units.

A first delay unit 901 delays the power up signal POWER_UPb. A first inverter 902 inverts the power up signal POWER_UPb. The logic gate 903 performs a NAND operation on outputs of the first delay unit 901 and the first inverter 902. A second inverter 904 inverts an output of the logic gate 903. A second delay unit 905 delays an output of the second inverter 904, thereby generating the pre-calibration signal PRE_ZQ.

FIG. 9B illustrates a signal timing diagram for operation of the pre-calibration signal generator described in FIG. 9A. The power up signal POWER_UPb is disabled at a logic high level at initialization of the semiconductor memory device and becomes a logic low level after a predetermined time. The pre-calibration signal PRE_ZQ is enabled as a pulse in response to the power up signal POWER_UPb. Waveforms E and F in FIG. 9B correspond to the waveforms at points E and F in FIG. 9A respectively.

In a similar way to that described in relation to FIGS. 8A and 8B, the time delays of the first delay unit 901 and the second delay unit 905 can be controlled, thereby making a pulse width of 0.5~1tCK and an enablement time of 10 ns respectively for the pre-calibration signal PRE_ZQ. At initialization of the semiconductor memory device, the time duration for enabling the power up signal POWER_UPb from a logic high level to a logic low level is not much different from the time duration for disabling the reset signal RESETb from a logic low level to a logic high level. Accordingly, the second delay unit 905 may have a time delay amount similar to that of the second delay unit 805 as described in FIG. 8A.

Figure 10B:
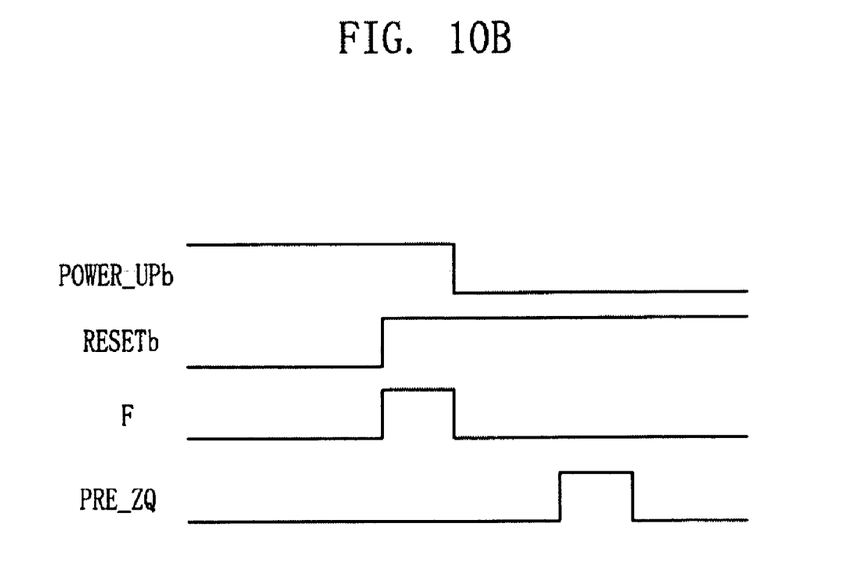
FIG. 10B is a signal timing diagram for the operation of the pre-calibration signal generator described in FIG. 10A.

FIGS. 10A and 10B illustrate a preferred embodiment for generating a pre-calibration signal PRE_ZQ from both the reset signal RESETb and the power up signal POWER_UPb. The pre-calibration signal generator using both the reset signal RESETb and the power up signal POWER_UPb includes a logic gate 1001, an inverter 1002 and a delay unit 1003.

The logic gate 1001 performs a NAND operation on the reset signal RESETb and the power up signal POWER_UPb. The inverter 1002 inverts an output of the logic gate 1001. The delay unit 1003 delays an output of the inverter 1002, thereby generating the pre-calibration signal PRE_ZQ.

FIG. 10B illustrates a signal timing diagram for operation of the pre-calibration signal generator described in FIG. 10A. A pulse signal F is generated by using the fact that the transition timings of the reset signal RESETb and the power up signal POWER_UPb are different. The pulse signal F is delayed to set enablement time of the pre-calibration signal PRE_ZQ, that is, it is delayed by approximately 10 ns as described above, thereby generating the pre-calibration signal PRE_ZQ.

Figure 11:
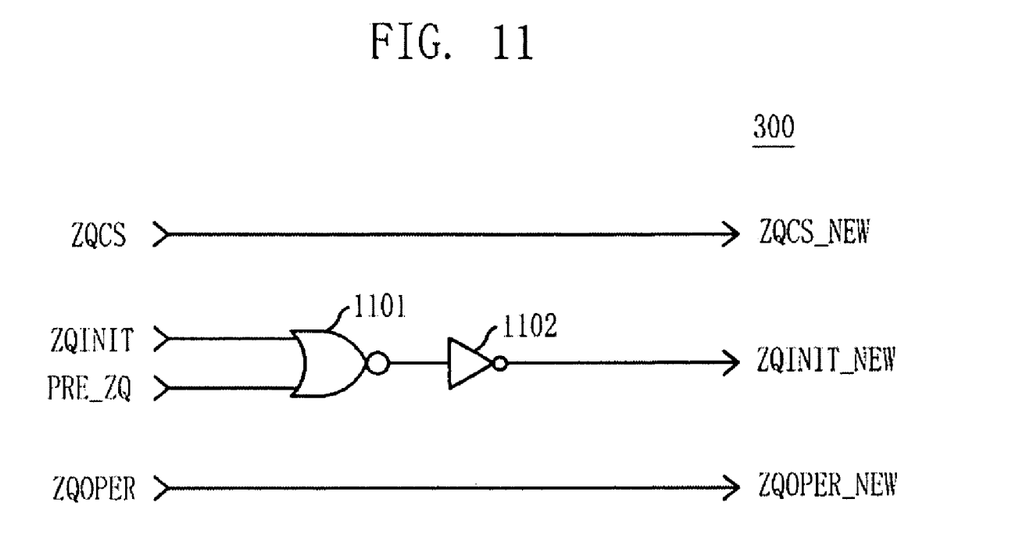
FIG. 11 is a block diagram of a control unit as described in FIG. 7.

FIG. 11 illustrates a block diagram of the control unit 300 described in FIG. 7. The control unit 300 includes a logic gate 1101 and an inverter 1102. The logic gate 1101 performs a NOR operation on the ZQ calibration signal ZQINIT and the pre-calibration signal PRE_ZQ. The inverter 1102 inverts an output of the logic gate 1101.

The control unit 300 enables the new ZQ calibration signals ZQCS_NEW, ZQINIT_NEW and ZQOPER_NEW in response to the ZQ calibration signals ZQCS, ZQINIT and ZQOPER generated from the ZQ calibration signal generator 100, respectively. When the pre-calibration signal PRE_ZQ is enabled from the pre-calibration signal generator 200, the control unit 300 enables the ZQ calibration ZQINIT_NEW for the initial ZQ calibration.

In that case, with a conventional ZQ calibration, the semiconductor memory device further performs the initial ZQ calibration when the pre-calibration signal PRE_ZQ is enabled at the initialization period. While the semiconductor memory device is powered up at the initialization period, the initial ZQ calibration is performed in response to the pre-calibration signal PRE_ZQ and the conventional ZQ calibration signal ZQINIT. Accordingly, the semiconductor memory device can complete the ZQ calibration and operate stably even if the variation of PVT is large.

While FIG. 11 illustrates a preferred embodiment where the ZQ calibration signal ZQINIT_NEW is enabled by the pre-calibration signal PRE_ZQ, the ZQ calibration signal ZQCS_NEW or ZQOPER_NEW are also enabled by adjusting the structure of the control unit 300. In that case, an operation time of the initial ZQ calibration according to the pre-calibration signal PRE_ZQ can be also adjusted.

The ZQ calibration controller in accordance with the present invention may further include a time counter described in FIG. 1, but this is omitted in FIG. 7. The time counter receives the ZQ calibration signals ZQCS_NEW, ZQINIT_NEW and ZQOPER_NEW and activates the comparators for a predetermined time according to the ZQ calibration signals ZQCS_NEW, ZQINIT_NEW and ZQOPER_NEW. The semiconductor memory device performs a corresponding type of ZQ calibration according to the ZQ calibration signals ZQCS_NEW, ZQINIT_NEW and ZQOPER_NEW.

Figure 12:
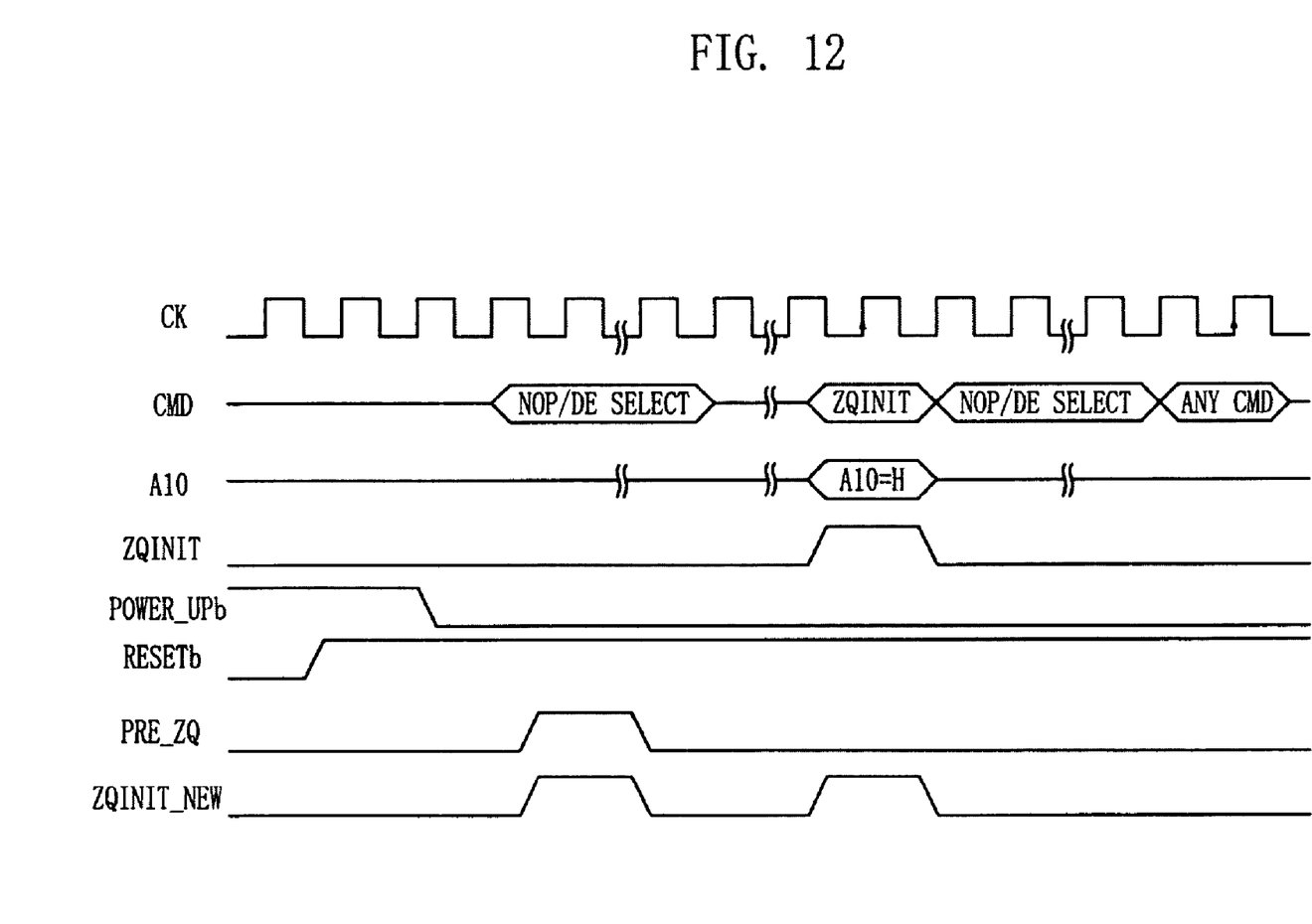
FIG. 12 is a signal timing diagram for the operation of the ZQ calibration controller in accordance with the present invention.

FIG. 12 illustrates a signal timing diagram for operation of the ZQ calibration controller in accordance with the present invention.

When the level transition of the reset signal RESETb or the power up signal POWER_UPb occurs in the initialization period of the semiconductor memory device, the pre-calibration signal PRE_ZQ is enabled after a predetermined time. The ZQ calibration signal ZQINIT_NEW is enabled by the pre-calibration signal PRE_ZQ and the ZQ calibration is performed at the initialization period. In addition, the ZQ calibration signal ZQINIT_NEW is enabled by the ZQ calibration command ZQC. The semiconductor memory device additionally performs the ZQ calibration at the initialization period.

That is, the conventional ZQ calibration circuit performs the ZQ calibration corresponding to the second enablement of the ZQ calibration signal ZQINIT_NEW shown in FIG. 12. In accordance with the present invention, the ZQ calibration circuit performs the ZQ calibration once more, which corresponds to the first enablement of the ZQ calibration signal ZQINIT_NEW enabled by the pre-calibration signal PRE_ZQ. Accordingly, the semiconductor memory device can complete the ZQ calibration even if the variation of PVT is large.

Figure 13:
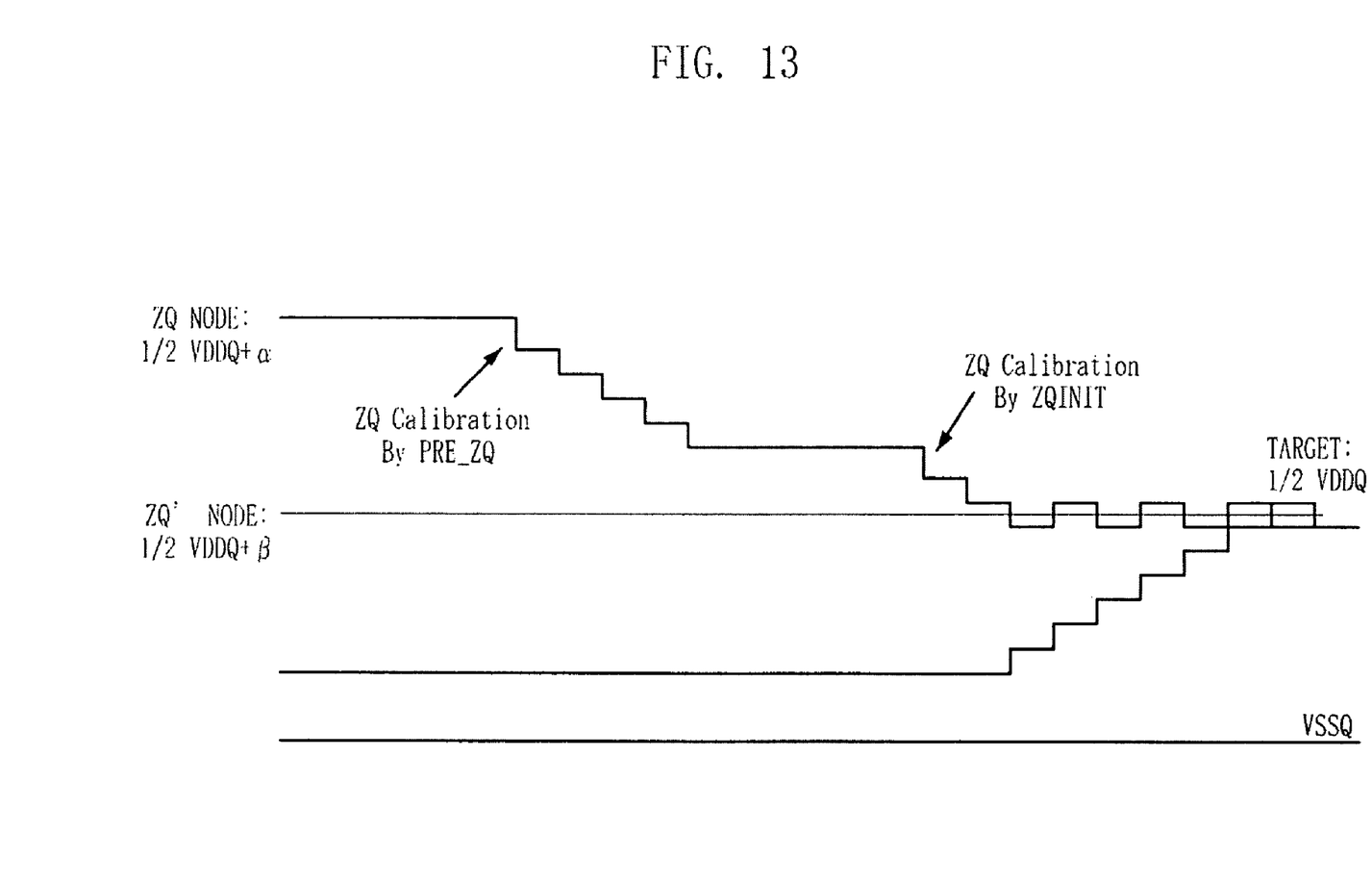
FIG. 13 is a timing diagram of voltage levels on the ZQ and ZQ' nodes of a ZQ calibration circuit in accordance with the present invention.

FIG. 13 illustrates a signal timing diagram of voltage levels on the ZQ and ZQ' nodes of a ZQ calibration circuit in accordance with the present invention.

Because the semiconductor memory device in accordance with the present invention additionally performs the ZQ calibration in the initialization period, it is possible for voltage levels on the ZQ and ZQ' nodes to stably reach a target level in the initialization period.

In accordance with the present invention, a method for performing ZQ calibration of a semiconductor memory device includes performing a pre-calibration in response to an initializing signal and performing a ZQ calibration in response to a ZQ calibration command. The pre-calibration is performed in response to at least one of the reset signal and the power up signal. The ZQ calibration is also performed in response to an external command.

While the present invention has been described with respect to the particular preferred embodiments, it will be apparent to those skilled in the art that various changes and modifications may be made without departing from the spirit and scope of the invention as defined in the following claims.

What is claimed is:

1. A ZQ calibration controller of a semiconductor memory device, comprising:
   a first signal generator for generating a pre-calibration signal during an initialization of the semiconductor memory device, wherein the pre-calibration signal is generated in response to an initialization signal whose logic level changes during the initialization;
   a second signal generator for generating ZQ calibration signals in response to a ZQ calibration command; and
   a control unit for outputting signals to control a ZQ calibration in response to the pre-calibration signal and the ZQ calibration signals.

2. The ZQ calibration controller of claim 1, wherein each of the ZQ calibration signals corresponds to a specific operating duration of the ZQ calibration.

3. The ZQ calibration controller of claim 2, wherein the control unit controls the operating duration of the ZQ calibration according to one of the ZQ calibration signals when the pre-calibration signal is enabled.

4. The ZQ calibration controller of claim 3, wherein the control unit includes:
   a logic gate for performing a NOR operation on the pre-calibration signal and one of the ZQ calibration signals;
   an inverter for inverting an output of the logic gate; and
   a transmitter for transmitting the remaining ZQ calibration signals.

5. The ZQ calibration controller of claim 1, wherein the initialization signal is selected from a group consisting of a reset signal, a power up signal, and a combination thereof.

6. The ZQ calibration controller of claim 1, wherein the ZQ calibration command is enabled in response to a chip selection signal, a row address strobe signal, a column address strobe signal and a write enable signal.

7. The ZQ calibration controller of claim 1, wherein the pre-calibration signal and the ZQ calibration signals are pulse type signals.

8. The ZQ calibration controller of claim 7, wherein the first signal generator includes:
   a first inverter for inverting a reset signal;
   a first delay unit for delaying an output of the first inverter;
   a logic gate for performing a NAND operation on the reset signal and an output of the first delay unit;
   a second inverter for inverting an output of the logic gate; and
   a second delay unit for delaying an output of the second inverter, thereby generating the pre-calibration signal.

9. The ZQ calibration controller of claim 7, wherein the first signal generator includes:
   a first delay unit for delaying a power up signal;
   a first inverter for inverting the power up signal;
   a logic gate for performing a NAND operation on outputs of the first delay unit and the first inverter;
   a second inverter for inverting an output of the logic gate; and
   a second delay unit for delaying an output of the second inverter, thereby generating the pre-calibration signal.

10. The ZQ calibration controller of claim 7, wherein the first signal generator includes:
   a logic gate for performing a NAND operation on a power up signal and a reset signal;
   an inverter for inverting an output of the logic gate; and
   a delay unit for delaying an output of the inverter, thereby generating the pre-calibration signal.

11. The ZQ calibration controller of claim 1, wherein the control unit controls the activation of a ZQ calibration circuit generating pull-up and pull-down codes.

12. A ZQ calibration circuit of a semiconductor memory device, comprising:
   a ZQ calibration unit for performing a ZQ calibration;
   a ZQ calibration controller for activating the ZQ calibration unit in response to a ZQ calibration command; and
   a pre-calibration controller for activating the ZQ calibration unit in response to an initializing signal whose logic level changes during an initialization of the semiconductor memory device.

13. The ZQ calibration circuit of claim 12, wherein the ZQ calibration unit performs the ZQ calibration in response to the initializing signal before an initial ZQ calibration according to the ZQ calibration command.

14. The ZQ calibration circuit of claim 13, wherein the ZQ calibration command is enabled in response to a chip selection signal, a row address strobe signal, a column address strobe signal and a write enable signal.

15. The ZQ calibration circuit of claim 13, wherein the initializing signal is selected from a group consisting of a reset signal, a power up signal, and a combination thereof.

16. A method for performing a ZQ calibration of a semiconductor memory device, the method comprising:
   performing a pre-calibration in response to an initializing signal whose logic level changes during an initialization of the semiconductor memory device; and
   performing a ZQ calibration in response to a ZQ calibration command.

17. The method of claim 16, wherein the pre-calibration is performed in response to an initialization signal selected from a group consisting of a reset signal, a power up signal, and a combination thereof.

18. The method of claim 16, wherein the ZQ calibration command is inputted from an external device.

* * * * *